(12) United States Patent
Thiyagarajan et al.

(10) Patent No.: US 8,085,824 B2
(45) Date of Patent: Dec. 27, 2011

(54) OPTIMIZATION OF LASER PARAMETERS TO ACHIEVE DESIRED PERFORMANCE

(75) Inventors: Sumesh Mani K. Thiyagarajan, Fremont, CA (US); Ashish K. Verma, San Jose, CA (US)

(73) Assignee: Finisar Corporation, Sunnyvale, CA (US)

( * ) Notice: Subject to any disclaimer, the term of this patent is extended or adjusted under 35 U.S.C. 154(b) by 599 days.

(21) Appl. No.: 12/129,518

(22) Filed: May 29, 2008

(65) Prior Publication Data
US 2008/0301595 A1 Dec. 4, 2008

Related U.S. Application Data

(60) Provisional application No. 60/932,622, filed on May 31, 2007.

(51) Int. Cl.
*G06F 17/50* (2006.01)
*H01S 3/13* (2006.01)
(52) U.S. Cl. .......... 372/29.02; 372/29.021; 372/29.022; 372/29.023; 716/136
(58) Field of Classification Search .................. 716/100, 716/133–134, 136; 372/29.01–29.016, 29.11–29.16, 372/29.02, 29.021–29.023
See application file for complete search history.

(56) References Cited

U.S. PATENT DOCUMENTS

| | | | |
|---|---|---|---|
| 6,698,000 B2 * | 2/2004 | Tanaka | 716/113 |
| 6,876,940 B2 * | 4/2005 | Mittal | 702/117 |
| 6,947,456 B2 * | 9/2005 | Chin et al. | 372/38.02 |
| 7,480,605 B2 * | 1/2009 | Angyal et al. | 703/14 |
| 7,650,580 B2 * | 1/2010 | Kucukcakar et al. | 716/100 |
| 7,657,416 B1 * | 2/2010 | Subasic et al. | 703/13 |
| 7,792,595 B1 * | 9/2010 | Bomholt et al. | 700/29 |
| 2002/0078429 A1 * | 6/2002 | Yoshida | 716/21 |
| 2003/0231689 A1 | 12/2003 | Vurgaftman et al. | |
| 2004/0120372 A1 | 6/2004 | Simsarian et al. | |
| 2005/0117622 A1 * | 6/2005 | Lenosky et al. | 372/96 |
| 2005/0172250 A1 * | 8/2005 | Kucukcakar et al. | 716/6 |
| 2005/0218925 A1 | 10/2005 | Miao et al. | |
| 2006/0062445 A1 * | 3/2006 | Verma et al. | 382/144 |
| 2006/0098699 A1 | 5/2006 | Sanchez | |
| 2006/0282802 A1 * | 12/2006 | Yechuri | 716/4 |
| 2007/0233447 A1 * | 10/2007 | Miyata et al. | 703/14 |
| 2007/0237194 A1 * | 10/2007 | Shahine | 372/29.011 |
| 2008/0028342 A1 * | 1/2008 | Tsuji et al. | 716/2 |
| 2009/0005894 A1 * | 1/2009 | Bomholt et al. | 700/97 |
| 2009/0276736 A1 * | 11/2009 | Mansfield et al. | 716/4 |
| 2010/0070938 A1 * | 3/2010 | Wang et al. | 716/4 |
| 2010/0121474 A1 * | 5/2010 | Bomholt et al. | 700/104 |
| 2010/0172383 A1 * | 7/2010 | Montalvo et al. | 372/38.01 |

FOREIGN PATENT DOCUMENTS
JP 2001-68775 3/2001
* cited by examiner

*Primary Examiner* — Stacy Whitmore
(74) *Attorney, Agent, or Firm* — Maschoff Gilmore & Israelsen

(57) ABSTRACT

One example disclosed herein relates to a method of at least partially optimizing one or more output performance parameters of a laser die. The method includes an act of identifying one or more output performance parameters to be at least partially optimized, an act of identifying one or more design parameters associated with the one or more output performance parameters, an act of determining a subset of the one or more design parameters that should be varied so as to at least partially effect the one or more output performance parameters, an act of varying the subset of design parameters to produce one or more intermediate results, and an act of using the intermediate results to determine values for the one or more design parameters such that the one or more performance parameters are at least partially optimized.

10 Claims, 11 Drawing Sheets

OPTIMIZATION OF LASER PARAMETERS TO ACHIEVE DESIRED PERFORMANCE

CROSS-REFERENCE TO RELATED APPLICATIONS

This application claims the benefit of U.S. Provisional Application No. 60/932,622, filed May 31, 2007, which is incorporated herein by reference in its entirety.

BACKGROUND

Semiconductor lasers are currently used in a variety of technologies and applications, including communications networks. One type of semiconductor laser is the distributed feedback ("DFB") laser. The DFB laser produces a stream of coherent, monochromatic light by stimulating photon emission from a solid state material. DFB lasers are commonly used in optical transmitters, which are responsible for modulating electrical signals into optical signals for transmission via an optical communication network.

Generally, a DFB laser includes a positively or negatively doped bottom layer or substrate, and a top layer that is oppositely doped with respect to the bottom layer. An active region, bounded by confinement regions, is included at the junction of the two layers. These structures together form the laser body. A grating is included in either the top or bottom layer to assist in producing a coherent light beam in the active region. The coherent stream of light that is produced in the active region can be emitted through either longitudinal end, or facet, of the laser body. DFB lasers are typically known as single mode devices as they produce light signals at one of several distinct wavelengths, such as 1,310 nm or 1,550 nm. Such light signals are appropriate for use in transmitting information over great distances via an optical communications network.

BRIEF SUMMARY

One example disclosed herein relates to a method of at least partially optimizing output performance for a laser die. The method includes an act of identifying a first design parameter, an act of identifying a second design parameter, the first and second design parameters configured to at least partially affect one or more output performance parameters of a laser die, an act of varying the first design parameter to produce first intermediate performance results, an act of varying the second design parameter to produce second intermediate performance results, and an act of using the first and second intermediate performance results to determine a value for the first and second design parameters that at least partially optimizes the one or more output performance parameters.

Another example disclosed herein relates to a method of at least partially optimizing one or more output performance parameters of a laser die. The method includes an act of identifying one or more output performance parameters to be at least partially optimized, an act of identifying one or more design parameters associated with the one or more output performance parameters, an act of determining a subset of the one or more design parameters that should be varied so as to at least partially effect the one or more output performance parameters, an act of varying the subset of design parameters to produce one or more intermediate results, and an act of using the intermediate results to determine values for the one or more design parameters such that the one or more performance parameters are at least partially optimized.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teaching herein. The features and advantages of the teaching herein may be realized and obtained by means of the instruments and combinations particularly pointed out in the appended claims. These and other features will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only illustrated embodiments of the invention and are therefore not to be considered limiting of its scope. The invention will be described and explained with additional specificity and detail through the use of the accompanying drawings in which.

DETAILED DESCRIPTION

Reference will now be made to figures wherein like structures will be provided with like reference designations. It is understood that the drawings are diagrammatic and schematic representations of presently preferred embodiments of the invention, and are not limiting of the present invention nor are they necessarily drawn to scale.

Example Operating Environment

Figure 1:
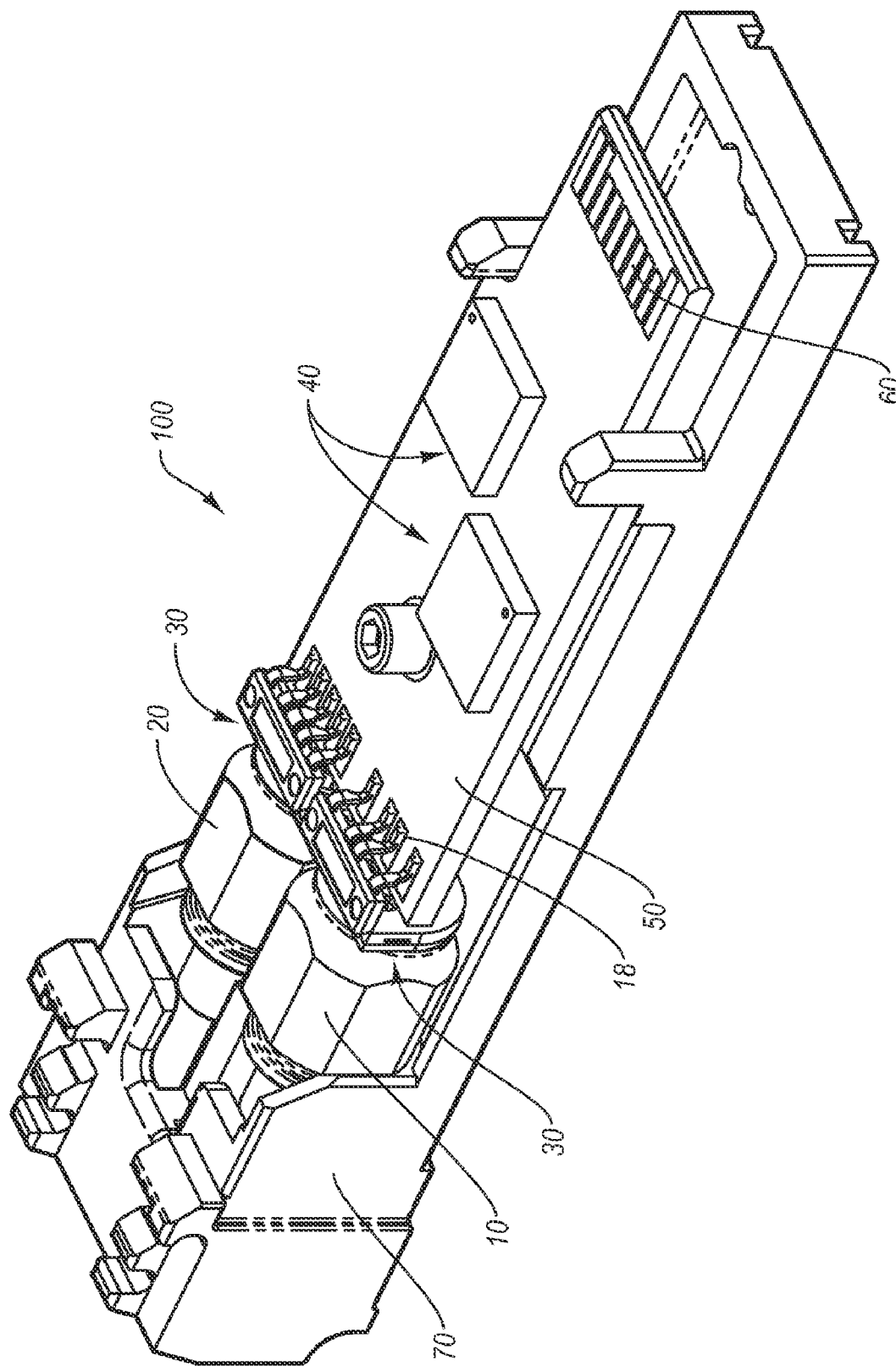
FIG. 1 is a perspective view of an optical transceiver module that serves as one exemplary environment in which examples of the present invention can be practiced.

Reference is first made to FIG. 1, which depicts a perspective view of an optical transceiver module ("transceiver"), generally designated at 100, for use in transmitting and receiving optical signals in connection with an external host that is operatively connected in one embodiment to a communications network (not shown). As depicted, the transceiver shown in FIG. 1 includes various components, including a receiver optical subassembly ("ROSA") 10, a transmitter optical subassembly ("TOSA") 20, electrical interfaces 30, various electronic components 40, and a printed circuit board ("PCB") 50. In detail, two electrical interfaces 30 are included in the transceiver 100, one each used to electrically connect the ROSA 10 and the TOSA 20 to a plurality of conductive pads 18 located on the PCB 50. The electronic components 40 are also operably attached to the PCB 50. An edge connector 60 is located on an end of the PCB 50 to enable the transceiver 100 to electrically interface with a host (not shown here). As such, the PCB 50 facilitates electrical communication between the ROSA 10/TOSA 20, and the host. In addition, the above-mentioned components of the transceiver 100 are partially housed within a shell 70. Though not shown, the shell 70 can cooperate with a housing portion to define a covering for the components of the transceiver 100.

While discussed in some detail here, the optical transceiver 100 is described by way of illustration only, and not by way of restricting the scope of the invention. As mentioned above, the optical transceiver 100 in one embodiment is suitable for optical signal transmission and reception at a variety of per-second data rates, including but not limited to 1 Gbit, 2 Gbit, 2.5 Gbit, 4 Gbit, 8 Gbit, 10 Gbit, or higher rates. Furthermore, the principles of the present invention can be implemented in optical transmitters and transceivers of shortwave and long wave optical transmission and any form factor such as XFP, SFP and SFF, without restriction.

The TOSA 20 of the transceiver 100 is one example of an optical transmitter that can employ an optical source, such as a semiconductor laser, that is configured according to embodiments of the present invention. Briefly, in operation the transceiver 100 receives electrical signals from a host (not shown) or other data signal-producing device to which the transceiver is operably connected for transmission onto an optical fiber operably connected to the TOSA 20. Circuitry of the transceiver 100 drives a laser (described below) within the TOSA 20 with signals that cause the TOSA to emit onto the optical fiber optical signals representative of the information in the electrical signal provided by the host. Accordingly, the TOSA 20 serves as an electro-optic transducer. Having described a specific environment with respect to FIG. 1, it will be understood that this specific environment is only one of countless architectures in which the principles of the present invention may be employed. As previously stated, the principles of the present invention are not intended to be limited to any particular environment.

Example Distributed Feedback Laser

A distributed feedback ("DFB") laser is one example of a semiconductor optical device employed according to embodiments of the present invention. By way of general overview, a DFB laser contains a cavity having an active medium and a distributed reflector that operates in a wavelength range of the laser action. The DFB laser has multiple modes, including both longitudinal and transversal modes, but one of these modes will typically offer better loss characteristics relative to the other modes. This single mode typically defines a single-frequency operation of the DFB laser.

The following description provides various details regarding a ten gigabit/second ("10 G") DFB laser configured for light emission at a wavelength of approximately 1310 nm. The following description includes both structural and functional characteristics of the 10 G DFB laser, together with certain details regarding the manufacturing processes used to build the laser. Note, however, that this description is meant to be exemplary only; indeed, lasers and other semiconductor optical devices having structural and/or functional aspects that differ from the present description can also benefit from the principles of embodiments of the present invention as disclosed herein. It is also appreciated that additional or alternative layers, layer thicknesses, or structures can be incorporated into the present laser device as will be understood by those of skill in the art. The following discussion is therefore not intended to limit the present invention in any way. In particular, the principles of the present invention may also be achieved in a 1310 nm 2.5 G DFB laser.

a. Base Epitaxial Layers

Figure 2:
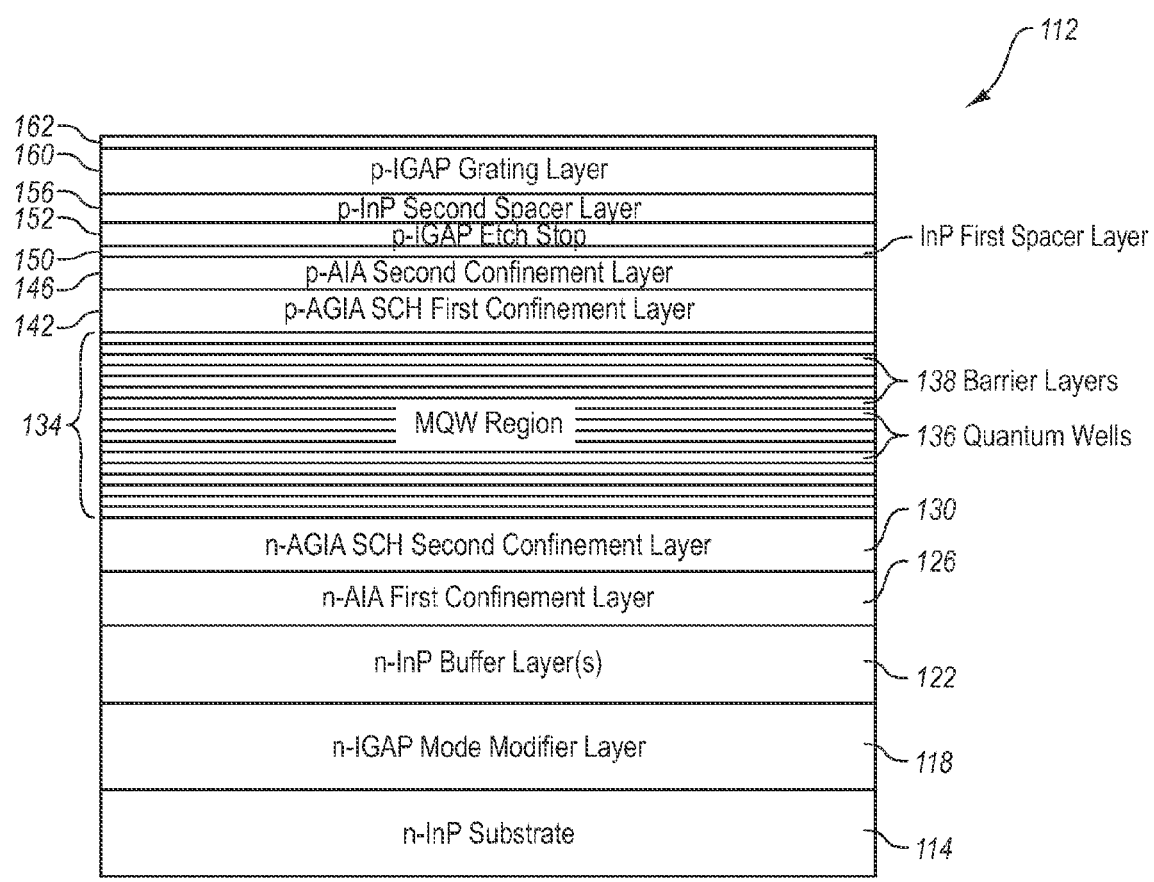
FIG. 2 is a cross sectional side view of an epitaxial base portion of a distributed feedback ("DFB") laser, according to one example of the present invention.

FIG. 2 illustrates layers of a base epitaxial portion 112 of a 10 G DFB laser, generally designated at 110, at a stage prior to etching of the grating layers. The DFB laser 110 is grown on an Indium Phosphide substrate (n-InP substrate) 114.

A "mode modifier" layer (n-IGAP Mode Modifier) 118 is grown on top of the substrate 114 using Indium Gallium Arsenide Phosphide at an approximate thickness of 120 nm. This layer functions to reduce the power of second-order transversal modes that propagate within the laser structure. In particular, the mode modifier layer 118 effectively increases the loss associated with these second-order transverse modes and couples the modes away from the gain medium of the laser. This suppression of second-order transverse modes allows for wider mesa widths on the laser because the laser is less sensitive to these modes.

A buffer layer 122 is grown on top of the "mode modifier" layer 118. This buffer layer provides a surface on which the n-layers of the laser are grown.

A first n-confinement layer 126 is grown on the buffer layer and is doped with silicon. A second n-confinement layer 130 is grown on the first n-confinement layer 126 layer and is also doped with silicon. Both of these layers are current confinement layers and effectively maintain electrons within the laser active region so that photons are produced. The second n-confinement layer 130 is graded to improve the confinement characteristics of the layer. The thicknesses of these n-layers were designed to be thin in order to optimize the thermal performance of the laser.

A multi-quantum well active region (MQW region) 134 is grown on the n-type confinement layers. The active region 134 is designed to have eight wells 136 with corresponding wavelengths of ~1295 nm. Quantum barriers 138 between the wells have corresponding wavelengths of approximately 980 nm. Standard barrier wavelengths are in the range of 1060-1090 nm and thus have smaller barrier heights than the present multi-quantum-well design. The depth and width of the wells are designed to produce a 1310 nm photon. The active region is designed to be "strain compensated" which means that the barriers are designed to have opposing strain characteristics relative to the well strain characteristics. As a result, the strain generated from the barriers at least partially cancels the strain generated by the wells and reduces the overall strain on the layer. The present well design is intentionally manufactured so that a complete cancellation of strain does not occur, but a small amount of strain remains for performance reasons.

In addition, the layers of the MQW region 134 are intentionally doped with Zn, to maintain a low-level p-type doping. This is done to assure that the p-n junction of the laser diode always occurs in the same place, and is not made variable by unpredictable dopant diffusion processes.

A first p-confinement layer 142 is grown on the active region. A second p-confinement layer 146 is grown on the first p-confinement layer 142 layer. Both of the p-layers are confinement layers and effectively maintain holes within the active region so that photons are produced. The layer 142 is graded to improve the confinement characteristics of the layer. The thicknesses of these p-layers were designed to be thin in order to optimize the speed and thermal performance of the laser.

A spacer layer 150 is located above the p-confinement layers. This spacer layer is made of Indium Phosphide. The thinness of the spacer layer improves the coupling efficiency of the grating and improves the speed of the laser. In particular, the spacer layer effectively controls the degree to which lateral current spreading occurs between the bottom of the ridge mesa and the active region.

Various "above-active" grating layers are located above the spacer layer 150. An etch stop layer 152 is grown on the spacer layer 150. This etch stop layer is provided for stopping the mesa etch.

A second spacer layer 156 is provided to separate the etch stop layer 152 and the grating layer. A grating layer 160 is grown on the second spacer layer 156. The grating layer is "above active" (as compared to other possible designs in which the grating is below the active region). Laser holography, wet etching, and subsequent InP regrowth, as explained further below, are used to create a uniform grating.

The laser cavity of the DFB laser 110 can support two degenerate longitudinal grating modes because the grating formed in the grating layer 160 is uniform (as opposed to, e.g., a quarter-wave shifted design). Selection of one or the other of these two modes is dependent upon the phase associated with the facet cleave, which is dependent upon the location of the cleave with respect to the grating period. Because the location of the cleave cannot be controlled with sufficient precision, all phase possibilities will be represented by any ensemble of devices of this design. As a result, there will always be a finite percentage of laser parts for which both grating modes are equally supported, resulting in inadequate single-mode behavior. These lasers are discarded and not sold.

A top layer 162 is provided above the grating layer on which regrowth of other layers is performed.

b. Grating Fabrication and Regrowth

Figure 3A:
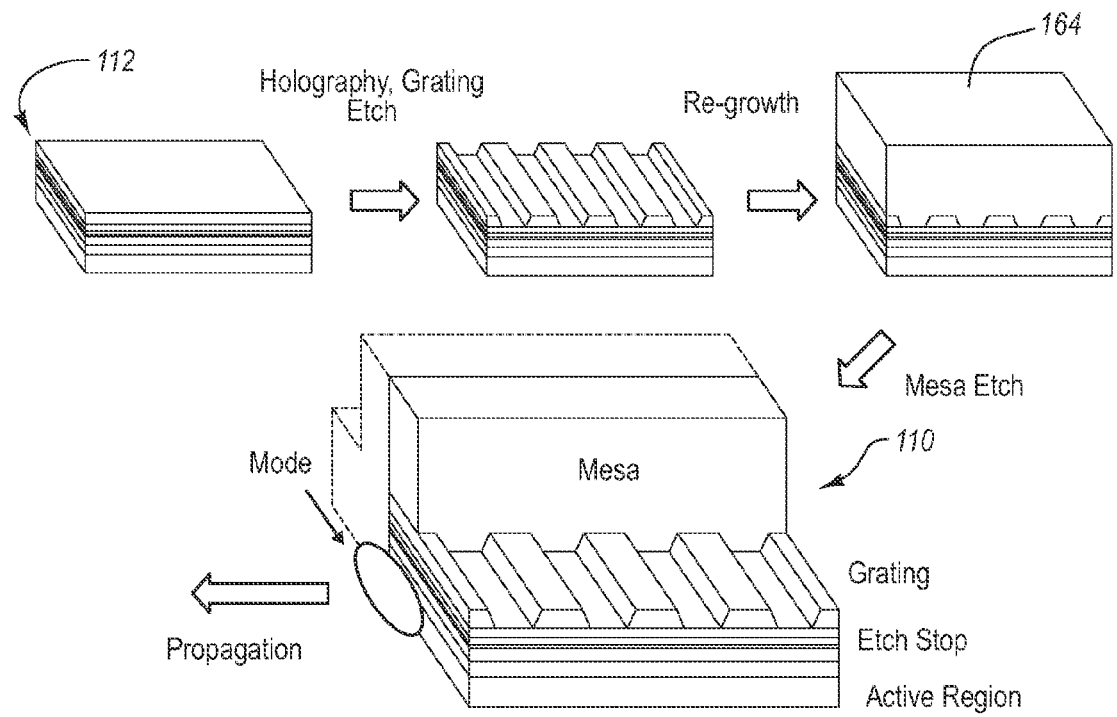
FIG. 3A is a progressive view of various processing and manufacture stages performed on the epitaxial base portion shown in FIG. 2.

FIG. 3 illustrates various grating fabrication and subsequent regrowth stages employed in forming portions of the structure of the DFB laser 110. In particular, FIG. 3 shows a side view of the base epitaxial structure 112 of FIG. 2, together with subsequent grating fabrication and regrowth of the DFB laser 110. As described above and by way of brief overview, a wet etch is performed to etch periodic gaps within the grating layer. After the etch is completed and the grating teeth are created, thick Indium Phosphide is grown on the etched, base epitaxial structure, in order to fill the gaps with low-index InP and also to form the mesa layer. The regrowth is completed with an Indium Gallium Arsenide layer for electrical contact.

This regrowth Indium Phosphide is used to create a mesa on the epitaxial base that provides current confinement and also functions as a waveguide, by virtue of lateral optical confinement. This structure is also referred to herein as a "ridge waveguide" structure. Photoresist is used to etch ridges on the regrowth that creates ridges to define the mesa of the DFB laser. Both dry and wet etching may be used in creating the mesa ridges.

After the etching process, a dielectric layer is placed on the structure. In the present design, a "triple stack" of Silicon Nitride, Silicon Dioxide, and Silicon Nitride is used as the dielectric, although other dielectrics may be used. This layer is typically thick in order to reduce parasitic capacitance (and improve speed) and is used to confine the current within the mesa. The dielectric layer is removed from the top of the mesa to allow an electrical contact and metallic layer to be placed on the mesa.

Electrical contact is made by depositing metal onto the Indium Gallium Arsenide layer at the top of the mesa. This contact is both a non-alloy contact and a low penetration contact.

A metallic layer is placed on the electrical contact to which electrical current may be provided to the laser structure. In the present embodiment, the metallic layer is made of three sub-layers of titanium, platinum and gold, although other materials could be used. A titanium layer is placed directly on the electrical contact layer, then a platinum layer and a gold layer is applied. This metallic layer provides sufficient conductivity to the Indium Gallium Arsenide layer so that current can be properly provided to the laser structure. Bottom electrical contacts are generated by thinning the InP substrate and placing an n-type metallic layer on the bottom.

A DFB laser is removed from a wafer using common techniques such as cleaving and breaking the wafer both horizontally and laterally to separate each laser. After this process, AR and HR coating is performed to encapsulate the active region of the laser and provide the requisite reflectivity characteristics of the laser cavity as may be seen in FIG. 3B as refectivities R1 and R2. The reflectivity characteristics define the optical power emitted from the back of the laser and the front of the laser. In uniform grating designs, a majority of the optical power is emitted from the front of the laser which couples into optical fiber. A minority of the optical power is emitted from the back of the laser which may couple with a photodetector (not shown) that is used to monitor the laser performance.

In one embodiment, the coating is made of layers of Silicon Oxide and Silicon. The reflectivity of the AR coating is designed to be less that 1% and the HR coating is designed to be greater than 96%. Once the coating process is complete, a testing process may be performed in which the power characteristics and optical spectrum are tested.

The example DFB laser 110 and photodetector are packaged into an optical sub-assembly, which is subsequently packaged into an optical module along with driver and control integrated circuits such as transceiver 100.

Although the above description was specifically tailored to a DFB laser, the examples disclosed herein may also be used in other high-speed lasers, such as a 1310 nm 10 G Fabry-Perot (FP) laser. The Fabry Perot laser, as is known in the art, is also grown on a substrate with various layers, a mesa and an active.

Aspects of Laser Design

Figure 4:
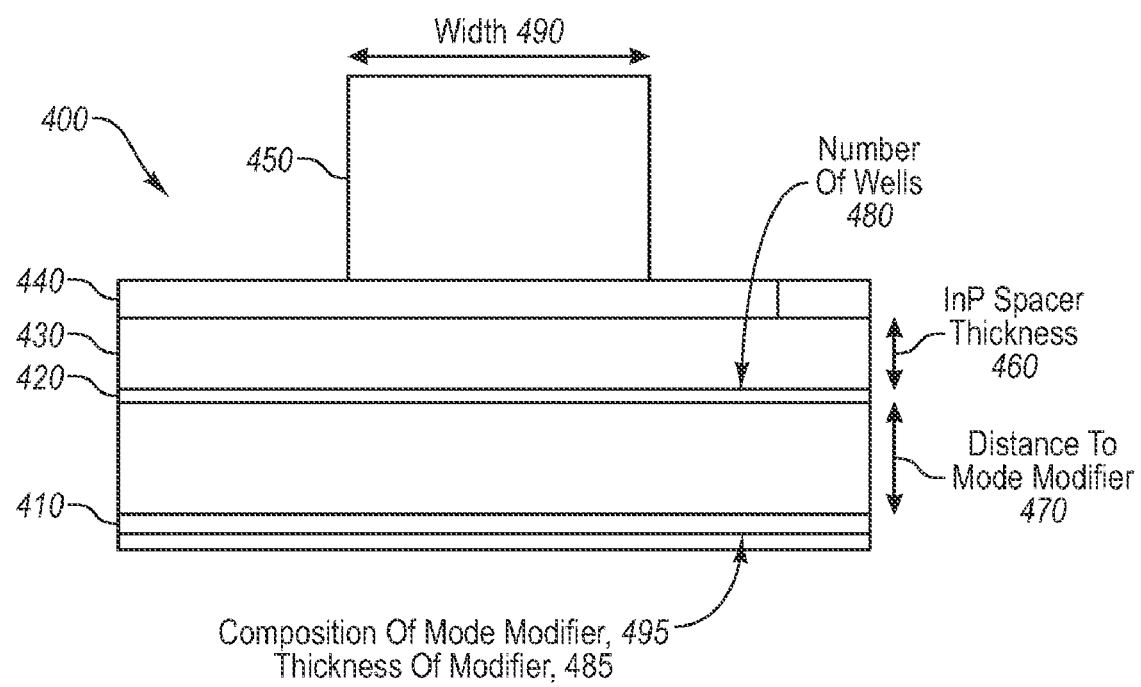
FIG. 4 is an illustration of a laser in which examples of the present invention can be practiced.

Reference is now made to FIG. 4, which illustrates a laser 400. Laser 400 may correspond to laser 110 previously described or it may correspond to other DFB or FP lasers. As illustrated, laser 400 includes at least a mode modifier level 410, an active region 420, an InP spacer layer 430, an etch stop layer 440, and a mesa 450. As will be appreciated and as is illustrated with respect to the embodiment of FIG. 2, laser 400 may also include additional layers to those illustrated.

While designing laser 400, a designer typically has several output performance parameters that should be met. In other words, the designer must account for these output performance parameters and often will make trade-offs among one or more output performance parameters in order to achieve a design with the most optimized performance possible. Of course, there may be circumstances when the most optimized performance may not be achievable. These typical performance parameters are listed below in Table 1. Note that other performance parameters may also be utilized.

TABLE 1

Linearity of output power vs. current curve
Modulation efficiency
Speed at a certain current
Threshold current over temperature As mentioned, the designer often will make trade-offs between the various output performance parameters. To make these trade-offs, there are several variable design parameters that a designer may use as listed below in Table 2. Of course, it will be appreciated that several other design parameters may also be used.

TABLE 2

Number of wells
Distance between etch stop and active region (p-InP spacer thickness)
Distance to mode modifier
Thickness of mode modifier
Composition of mode modifier
Mesa width
Cavity length
Mirror reflectivities, R1 and R2

Figure 3B:
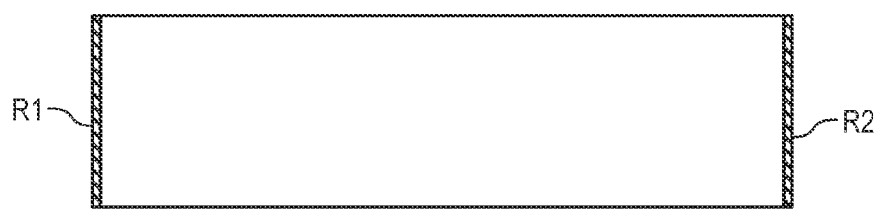
FIG. 3B illustrates mirror reflectivities R1 and R2.

Referring again to FIG. 4, the various design parameters of Table 2 are illustrated in relation to the various layers previously described. For example the InP spacer layer 430 thickness is designated at 460, the distance from the active region 420 to the mode modifier layer 410 is designated at 470, the number of wells is designated at 480, the composition of the mode modifier layer 410 is designated at 495, the thickness of the mode modifier layer 410 is designated at 485, and the width of the mesa 450 is designated at 490. As mentioned above, the mirror reflectivities R1 and R2 are shown in FIG. 3B.

As will be appreciated, the distance 470 between the active region 420 and the mode modifier layer 410 is comprised of the one or more layers that separate the mode modifier layer from the active region. In the example discussed in relation to FIG. 2 above, this distance may include one or more of the buffer layer 122, the first confinement layer 126, and the second confinement layer 130.

Likewise, in some examples the InP spacer layer 430 and its thickness 460 may comprise one or more layers. For instance, in the example discussed in relation to FIG. 2 above, in some instances the first and second confinement layers 142 and 146 in addition to spacer layer 150 may comprise the thickness 460, while in other instances the spacer layer 150 alone may comprise the thickness 460.

Figure 5A:
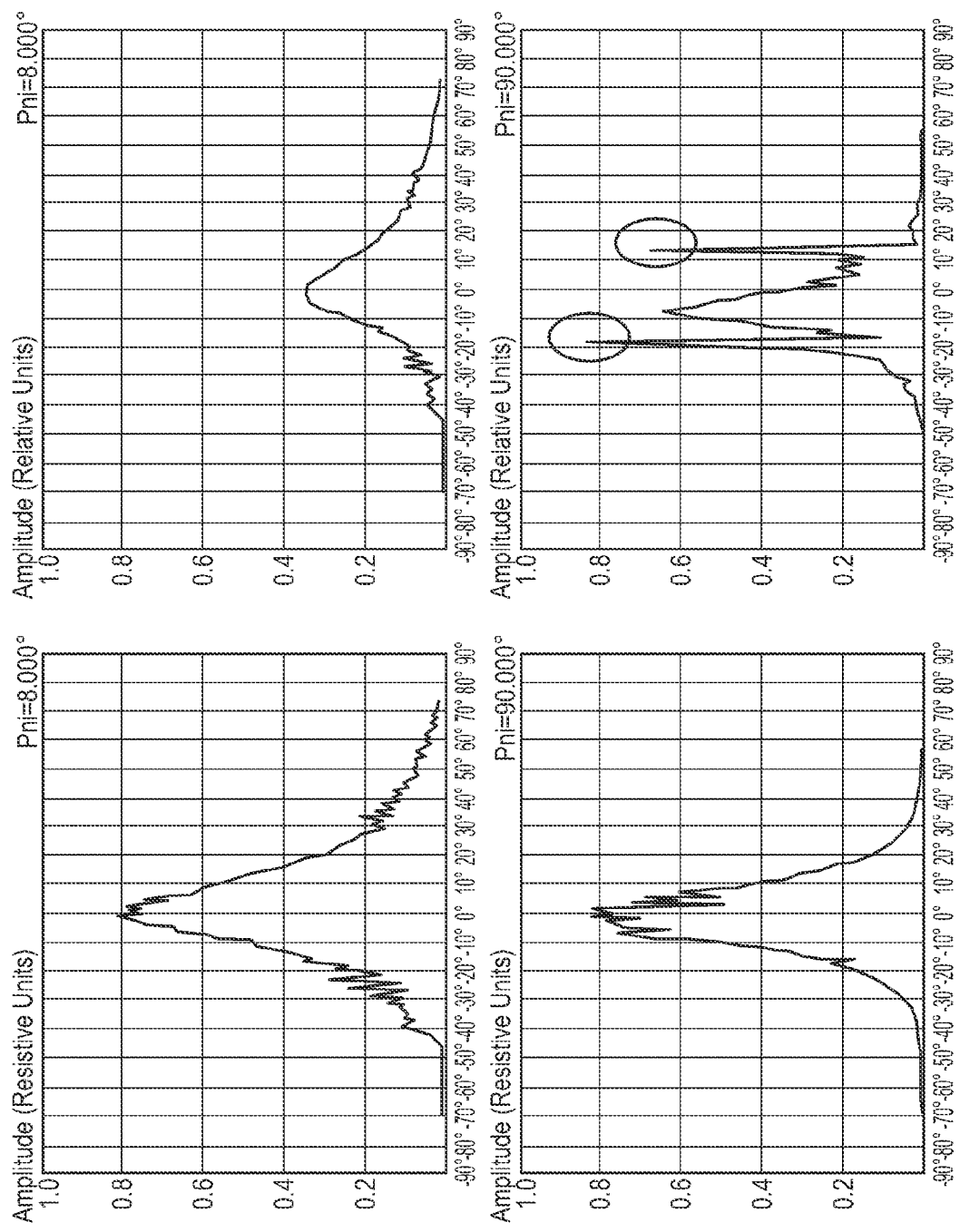
FIG. 5A illustrates far field angle spectra of a laser such as laser of FIG. 4.
Figure 5B:
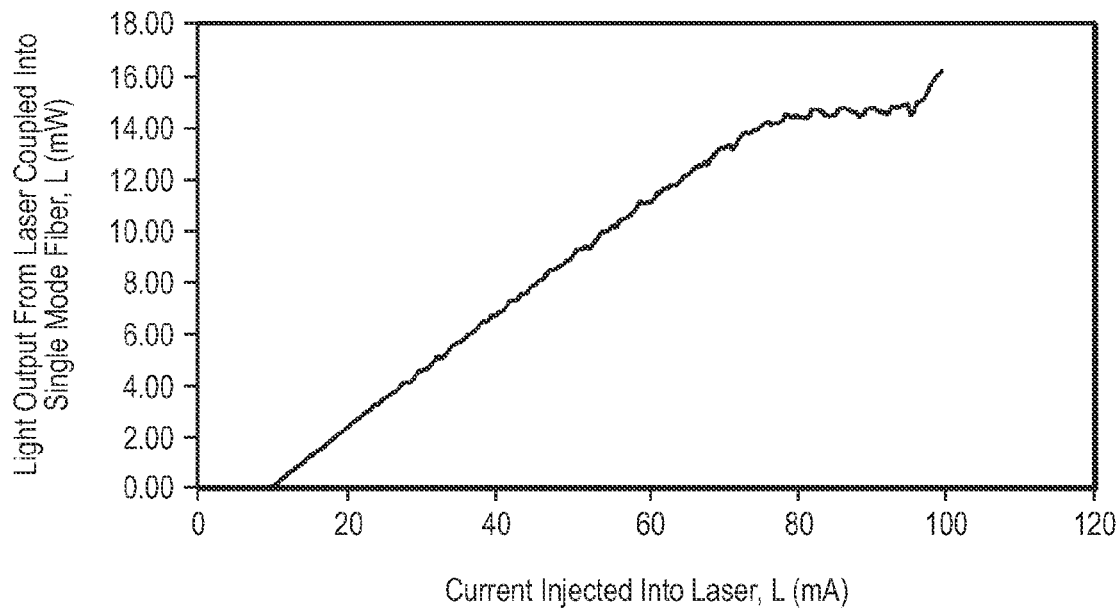
FIG. 5B illustrates non-linearity in an output power vs. current curve of a laser such as laser of FIG. 4.

Referring now to FIGS. 5A and 5B, two graphs of the output performance of a laser such as laser 400 are shown. FIG. 5A illustrates far field angle spectra of a laser such as laser 400. The figure on the left is at a current, I=25 mA and figure on the right is at I=90 mA. The presence of a side lobe is clearly seen (marked by the circles) at large currents and not at lower current levels. This is the cause of the significant non-linearity in the output power vs. current curve shown in FIG. 5B.

Figure 5C:
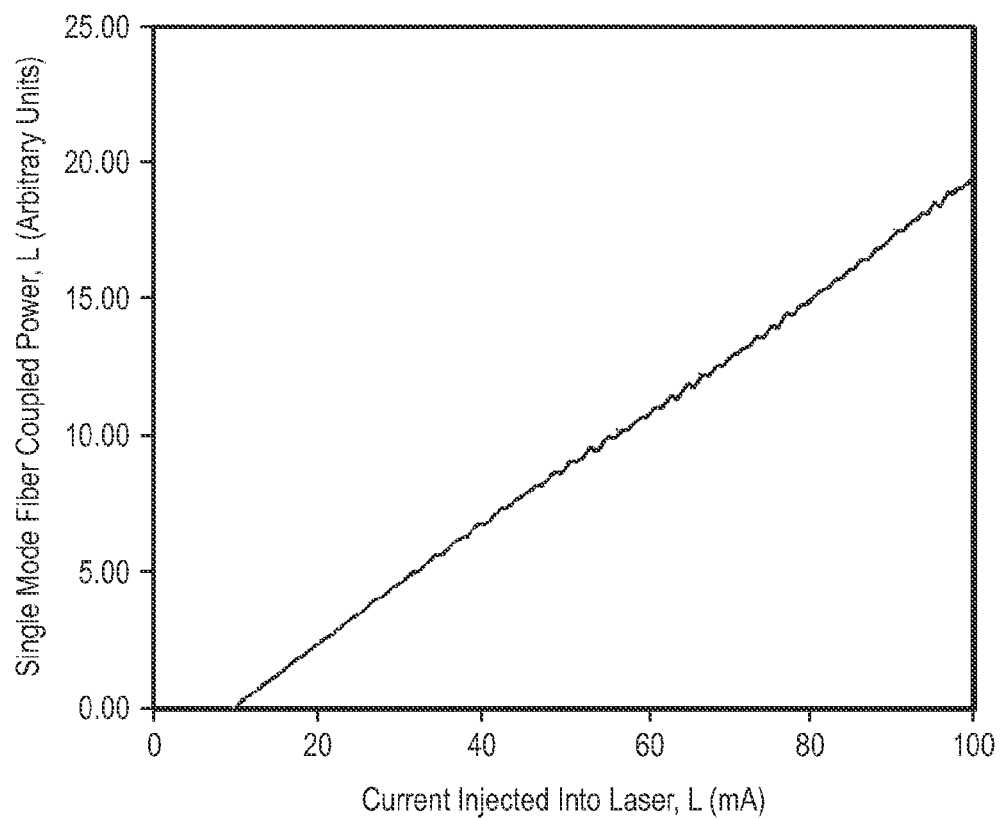
FIG. 5C illustrates linearity in an output power vs. current curve of a laser such as laser of FIG. 4.

Suppressing this side lobe (aka second order mode) without compromising the performance of the laser (threshold current, slope efficiency, high speed performance) may be challenging. Advantageously, the principles of the present invention provide a solution to this challenge. By altering the design parameters shown in Table 2, the non-linearity of the LI curve (output power vs. injected current) can be significantly reduced, as seen in FIG. 5C. In addition, the other three output performance parameters as shown in Table 1 may at least be partially optimized.

Accordingly, the principles of the present invention allow a designer to vary one or more of the design parameters of Table 2 in order to at least partially optimize one or more of the output performance parameters of Table 1 to thereby at least partially optimize output performance of laser 400. For instance, in one example, a designer may be interested in optimizing the gain margin of the laser 400. Optimizing the gain margin of laser 400 may help to improve the linearity of the output power versus current curve as well as the other three output performance parameters listed in Table 1. Accordingly, the designer may vary one or more of the design parameters to achieve the desired result.

Figure 6:
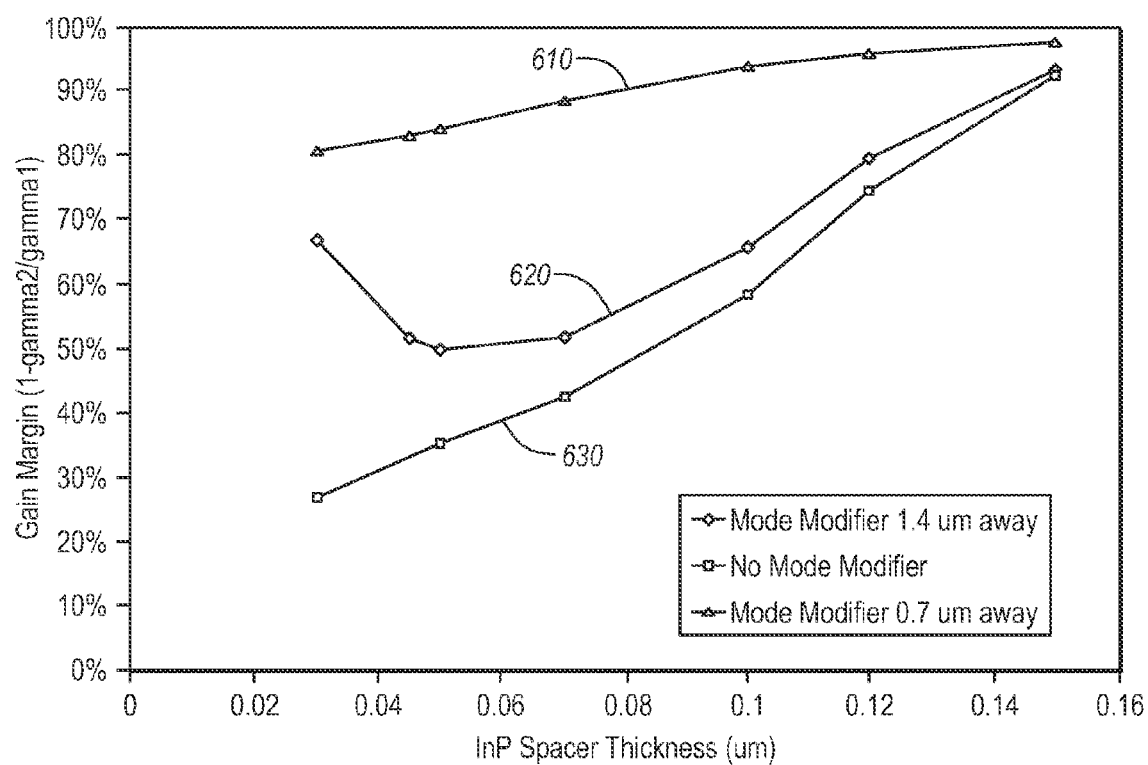
FIG. 6 illustrates the effects on gain margin when varying one or more design parameters in accordance with examples disclosed herein.

For instance, FIG. 6 illustrates the effects on gain margin when varying the thickness 460 of the InP spacer layer 430, the distance 470 between the active region 420 and the mode modifier layer 410, and the thickness 485 of the mode modifier layer 410. As illustrated, FIG. 6 shows the gain margin on the Y-axis versus the InP spacer thickness 460 on the X-axis. In FIG. 6, the width 490 of the mesa 450 is kept constant at 2.1 micro-meters (μm). In addition, the thickness 485 of the mode modifier 410 is kept constant at 0.14 μm when the mode modifier is present.

Referring first to line 610, the performance results are shown when the thickness 460 of the InP spacer layer 430 is varied and the distance 470 between the active region 420 and the mode modifier layer 410 is kept constant at 1.4 μm. The ridge width 490 and the thickness 485 of the mode modifier are also kept constant as previously described. For example, as InP spacer thickness 460 is increased from approximately 0.02 μm to approximately 0.15 μm, the gain margin increases.

Likewise, line 630 illustrates the performance results when thickness 460 of the InP spacer layer 430 is varied, the distance 470 between the active region 420 and the mode modifier layer 410 is kept constant at 0.7 μm, and the mesa width 490 and the thickness 485 of the mode modifier are also kept constant as previously described. In this case, as InP spacer thickness 460 is increased from approximately 0.02 μm to approximately 0.15 μm, the gain margin also increases. Line 620 illustrates that when keeping the mesa width 490 constant and removing the mode modifier layer 410, as InP spacer thickness 460 is increased from approximately 0.04 μm to approximately 0.15 μm, the gain margin also increases.

Figure 7:
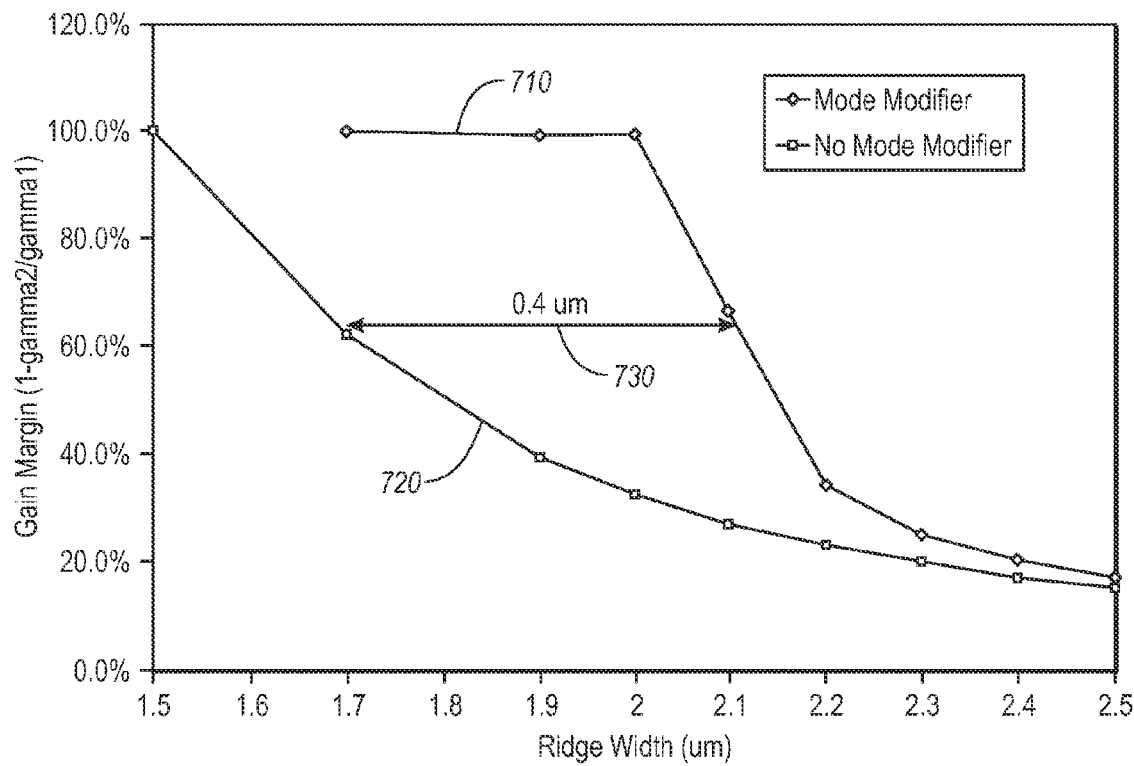
FIG. 7 illustrates the effects on gain margin when varying one or more design parameters in accordance with examples disclosed herein.

In another example, the designer may vary the mode modifier layer 410 and the width 490 of the mesa 450. For example, FIG. 7 illustrates the effects on gain margin when the thickness 460 of the InP spacer layer 430 is kept constant at 0.03 um, the distance 470 between the active region 420 and the mode modifier layer 410 is kept constant at 1.4 um, and the mesa width 490 and mode modifier layer 410 are varied.

Referring first to line 710, it is shown that when a mode modifier layer 410 with a thickness 485 of 0.14 um is included in laser 400, the gain margin will decrease as the mesa width 490 is increased. Likewise, line 720 shows that when the mode modifier layer 410 is not included, the gain margin will also decrease as the mesa width 490 is increased.

However, line 730 shows that if 60% is the lowest acceptable gain margin, then mesa width 490 may be 0.4 microns wider when the mode modifier layer 410 is included to have the same acceptable results (i.e., gain margin 60% or higher) as when mode modifier layer 410 is not included. In other words, in those circumstances where a smaller mesa width 490 is necessary, the designer may remove the mode modifier layer 410 and still achieve an acceptable gain margin. Conversely, in those circumstances where a larger mesa width 490 is necessary, the designer may include in the mode modifier layer 410 to allow for a wider mesa while still achieving an acceptable gain margin. A larger mesa width is more easily manufacturable and hence leads to a lower chip cost. A good designer will incorporate manufacturability and cost into consideration in addition to the items in Table 1.

Figure 8:
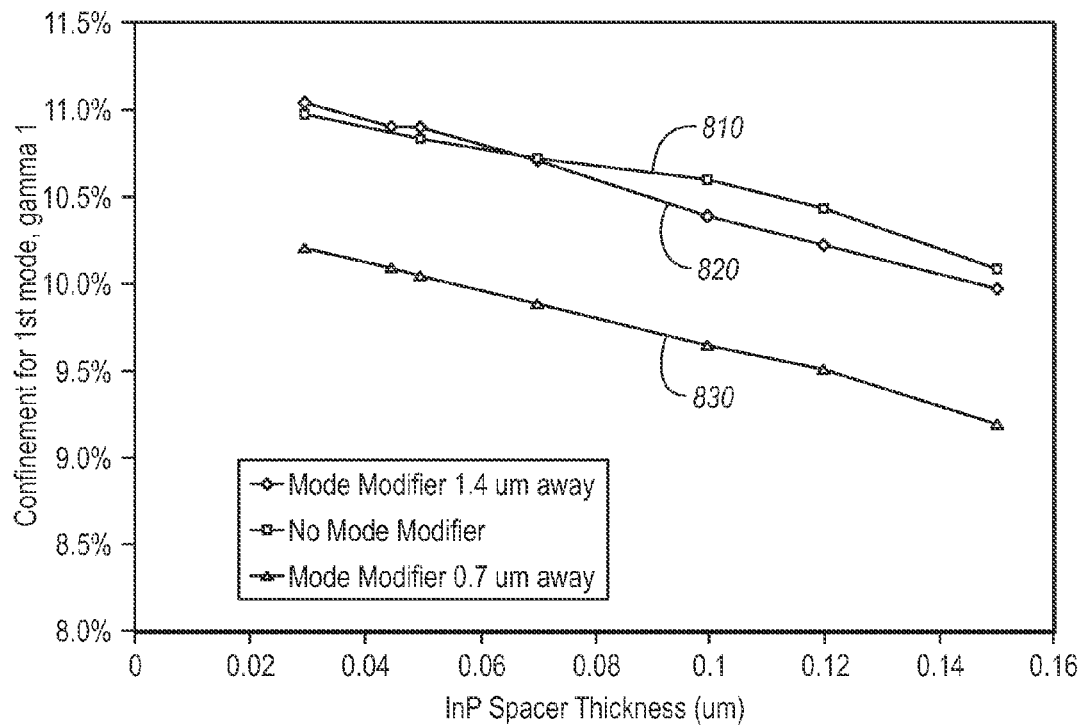
FIG. 8 illustrates the effects on confinement when varying one or more design parameters in accordance with examples disclosed herein.

In a further example, the designer may be interested in optimizing the confinement of a first mode. To accomplish this, the designer may use the variable design parameters. For example, FIG. 8 illustrates the effects on confinement of the first mode where the mesa width 490 is kept constant at 2.1 um and the mode modifier layer 410 thickness 485 is kept constant at 0.14 um. As is shown in lines 810, 820, and 830, when the thickness 460 of the InP spacer layer 430 is varied from 0.02 μm to approximately 0.15 μm, the confinement decreases as InP spacer thickness increases.

Lines 810, 820, and 830 also show that making the distance 470 between the active region 420 and the mode modifier layer 410 smaller also decreases confinement. For instance, confinement is better across all InP spacer thicknesses when the distance 470 is 1.4 μm than when the distance 470 is 0.7 μm. In addition, having no modifier layer 410 provides better confinement than having a small distance 470.

As mentioned previously, a designer may also be interested in at least partially optimizing modulation efficiency, speed at a certain current, and threshold current over temperature, which are some of the performance parameters listed in table 2. Accordingly, the designer may also vary one or more of the variable design parameters of table 1 in order to at least optimize these performance parameters.

Figure 9:
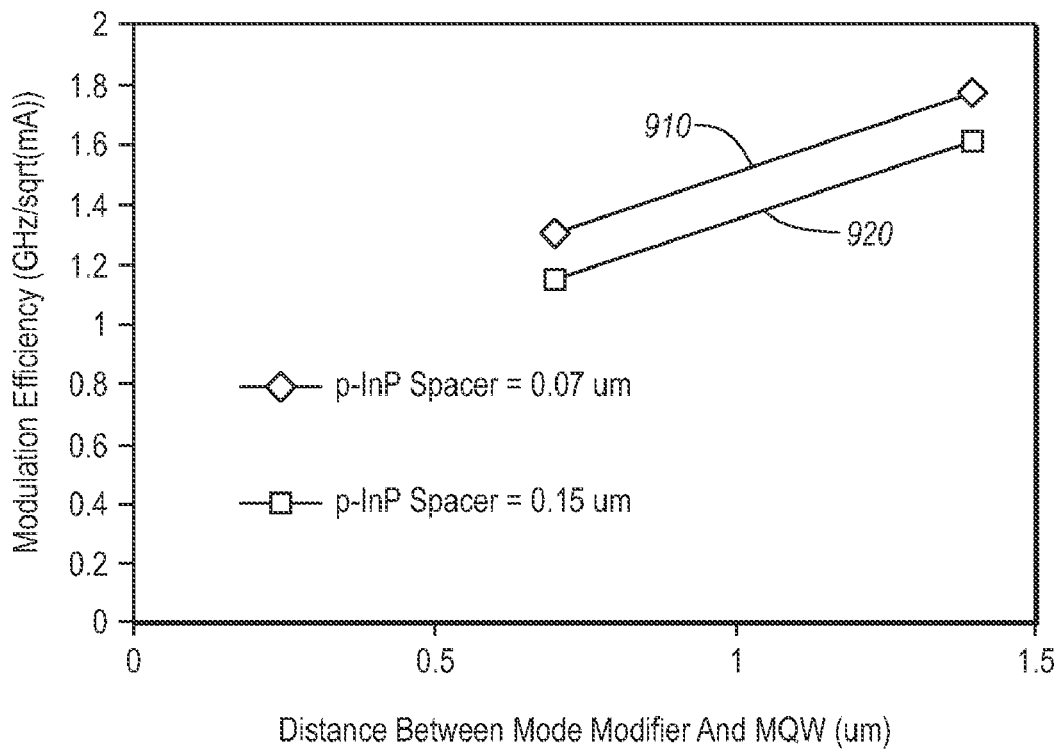
FIG. 9 illustrates the effects on modulation efficiency when varying one or more design parameters in accordance with examples disclosed herein.

Referring first to FIG. 9, a plot is shown of modulation efficiency when varying the distance 470 between the active region 420 and the mode modifier layer 410. For example, line 910 shows that when the thickness 460 of the InP spacer layer 430 is kept constant at 0.07 μm, modulation efficiency increases as the distance 470 is increased. Likewise, line 920 shows that when the thickness 460 of the InP spacer layer 430 is kept constant at 0.15 μm, modulation efficiency increases as the distance 470 is increased.

Figure 10:
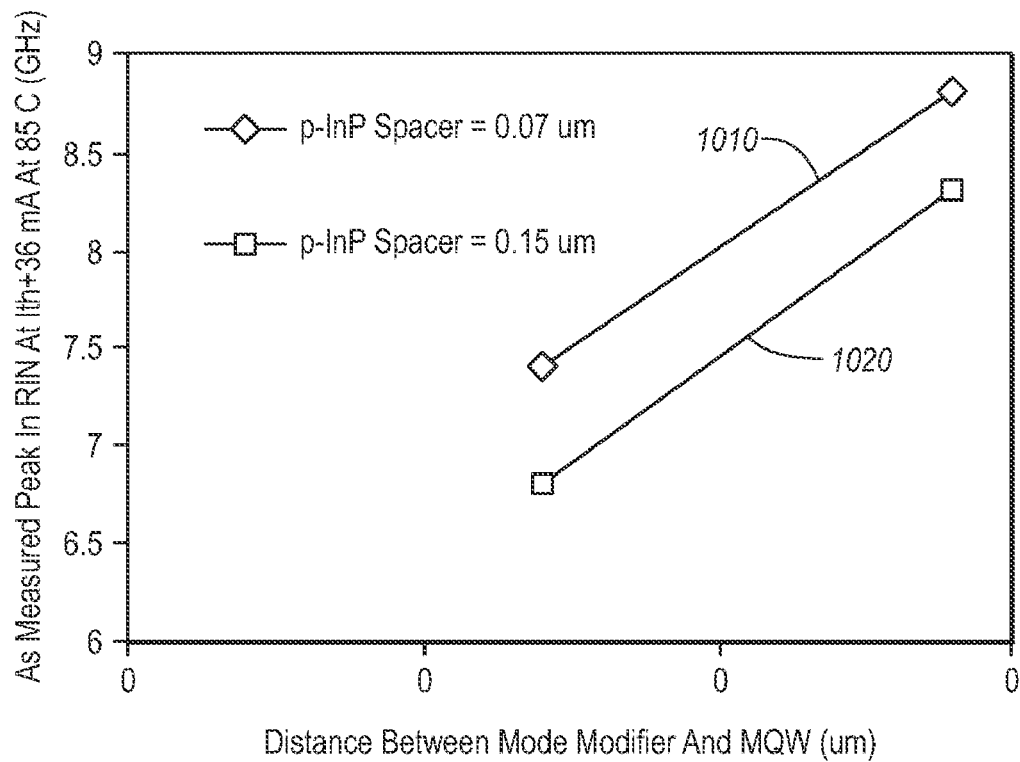
FIG. 10 illustrates the effects on laser speed at a certain temperature when varying one or more design parameters in accordance with examples disclosed herein.

Referring now to FIG. 10, a plot is shown of speed at a certain current, in this case the threshold current+36 mA, when varying the distance 470 between the active region 420 and the mode modifier layer 410. For example, line 1010 shows that when the thickness 460 of the InP spacer layer 430 is kept constant at 0.07 μm, speed at a certain current increases as the distance 470 is increased. Likewise, line 1020 shows that when the thickness 460 of the InP spacer layer 430 is kept constant at 0.15 μm, speed at a certain current increases as the distance 470 is increased.

Figure 11:
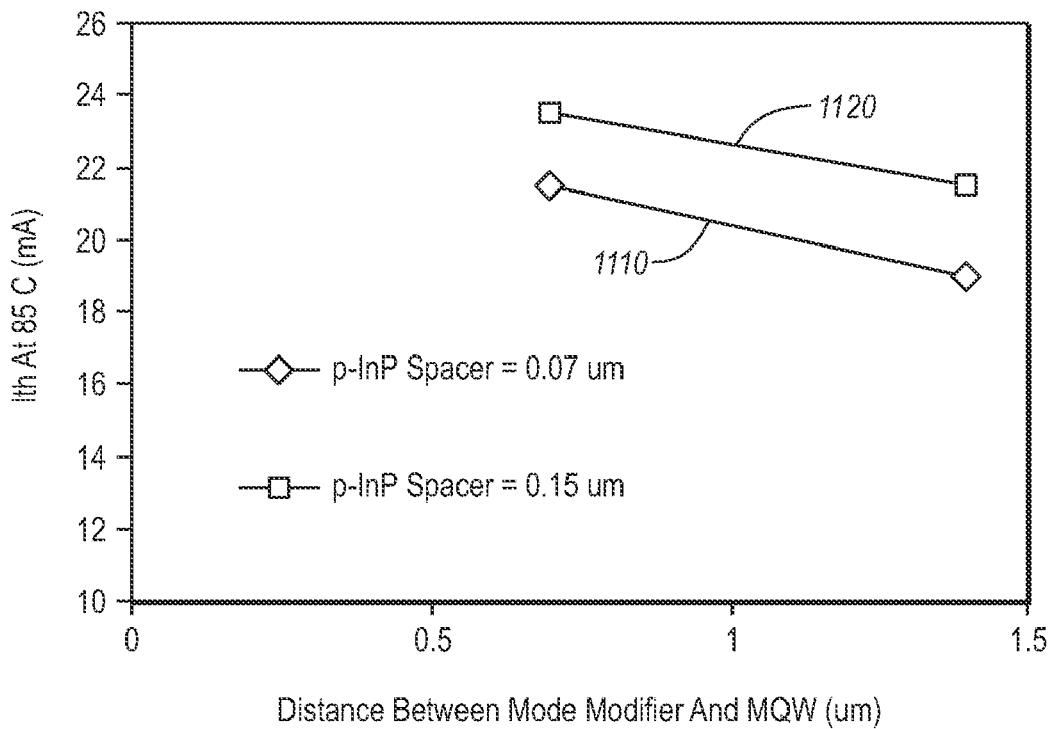
FIG. 11 illustrates the effects on threshold current over temperature when varying one or more design parameters in accordance with examples disclosed herein.

Referring now to FIG. 11, a plot is shown of threshold current at 85 degrees Celsius, which can be used to approximate threshold current over temperature, when varying the distance 470 between the active region 420 and the mode modifier layer 410. For example, line 1110 shows that when the thickness 460 of the InP spacer layer 430 is kept constant at 0.07 μm, the threshold current decreases as the distance 470 is increased. Likewise, line 1120 shows that when the thickness 460 of the InP spacer layer 430 is kept constant at 0.15 μm, the threshold current decreases as the distance 470 is increased.

As previously mentioned, the designer may also vary the number of wells in the active region, the length of the active region cavity, and the facet or mirror reflectivities. For example, varying the number of wells in the active region and/or the length of the cavity may affect the performance parameters previously described. In like manner, varying the amount of reflective material applied to the facet edges as described above may also affect the performance parameters.

Accordingly, based on FIGS. 5C-11, it is seen that it is desirable for the designer to improve the gain margin between the fundamental or first order mode (the mode the laser should operate in) and the second order mode (the mode which should be suppressed). However, the designer must be careful not to adversely impact the confinement for the fundamental mode, threshold current, slope efficiency, and high speed performance. In other words, the designer will make trade-offs between the various design parameters in order to at least partially optimize the laser. For example, as shown in FIG. 6, increasing the spacer thickness 460 tends to improve the gain margin. However, FIG. 8 shows that decreasing the spacer thickness 460 tends to improve the confinement. Accordingly, the designer will need to pick a spacer thickness 460 that provides both acceptable gain margin and acceptable confinement. In other words, the designer will need to trade-off between desired gain and confinement and pick a value for the spacer thickness 460 that provides both acceptable gain margin and acceptable confinement. The designer will also need to make trade-offs between the other design parameters as illustrated in the figures to arrive at values of the design parameters that produce desirable output performance parameter levels and thus provide acceptable laser 400 performance.

Figure 12:
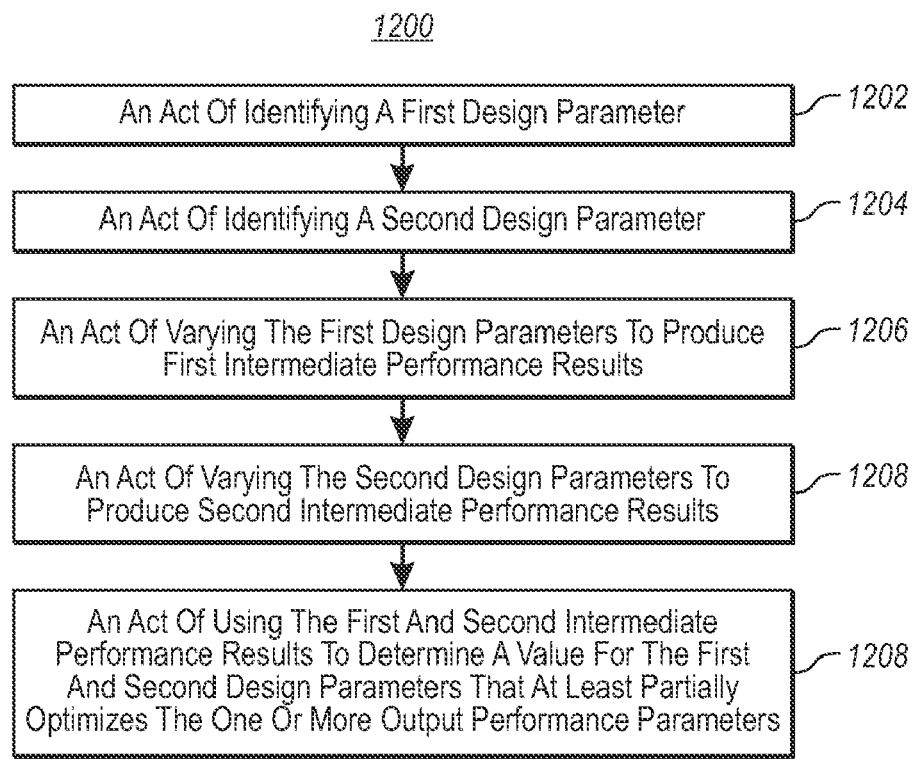
FIG. 12 illustrates a flowchart of a method for at least partially optimizing output performance for a laser die in accordance with examples disclosed herein.

Turning now to FIG. 12, a flowchart of a method 1200 for at least partially optimizing output performance for a laser die is illustrated. Method 1200 will be explained in relation to the other figures previously described above, although method 1200 is not limited to such examples.

Method 1200 includes an act of identifying a first design parameter (act 1202) and an act an act of identifying a second design parameter (act 1204). The first and second design parameters are configured to at least partially affect one or more output performance parameters of a laser die. For example, a designer may identify one or more of the design parameters listed in Table 2 above. As previously described, these design parameters are configured to at least partially affect the output performance parameters listed in Table 1. The designer would typically identify those design parameters most closely associated with the output performance parameter of interest. Note that in some examples, the designer may also identify third and fourth design parameters as circumstances warrant. Further, in other examples the first and second design parameters may be the same parameter and the third and fourth design parameters may be the same parameters.

Method 1200 also includes an act of varying the first design parameter to produce first intermediate performance results (act 1206) and an act of varying the second design parameter to produce second intermediate performance results (1208).

For instance, using FIG. 6 as an example, in one example, the designer may vary a first design parameter such as the spacer thickness 460 to produce intermediate results that show how gain margin is affected by varying the spacer thickness. The designer may also vary a second design parameter such as the distance 470 between the active region and the mode modifier layer to produce second intermediate results that show how gain margin is affected by varying the distance 470 or having no mode modifier layer at all.

In another example, act 1206 is performed when the designer varies a first design parameter to produce first intermediate results about a first output performance parameter. Act 1208 is then performed when the designer varies a second design parameter to produce second intermediate results about a second output performance.

For instance, using FIGS. 6 and 8 as an example, the designer may vary a first design parameter such as the spacer thickness 460 to produce intermediate results that show how gain margin is affected by varying the spacer thickness. The designer may then vary a second designer variable such as spacer thickness 460 to produce intermediate results that show how confinement is affected by varying the spacer thickness. It should be noted that this is an example of where the first and second design parameters are the same. It will be appreciated that in other examples the first and second design parameters may be different. For instance the first design parameter may be spacer thickness 460 and the second design parameter may be mesa width 490 as shown in FIG. 7.

In some examples, a third design parameter may be varied and may be used in conjunction with the first design parameter to produce the first intermediate results. Referring again to FIG. 6, the distance 470 between the active region and the mode modifier layer may be varied while also varying the spacer thickness 460 to produce the first intermediate results as shown in the figure.

A fourth design parameter may also be varied and may be used in conjunction with the second design parameter to produce the second intermediate results. Referring again to FIG. 8, the distance 470 between the active region and the mode modifier layer may be varied while also varying the spacer thickness 460 to produce the second intermediate results as shown in the figure. It should be noted that this is an example of where the third and fourth design parameters are the same. It will be appreciated that in other examples the third and fourth design parameters may be different.

Turning again to FIG. 12, method 1200 further includes an act of using the first and second intermediate performance results to determine a value for the first and second design parameters that at least partially optimizes the one or more output performance parameters (act 1210). For example, the designer may use the intermediate results to determine which value or set of values for the design parameters will cause the one or more output performance parameters to be at least partially optimized. In some embodiments, the designer will need make trade-offs based on the intermediate results. It should be noted that the term value as used in claims need not be limited to a single value, but may also include a set of more than one value.

For instance, using FIGS. 6 and 8 as an example, the designer will have to determine, based on the intermediate results previously discussed, what value or set of values of spacer thickness 460 will provide both acceptable gain margin and confinement. As previously discussed, a larger spacer layer thickness 460 provides better gain margin while a smaller spacer thickness 460 provides better confinement. Accordingly, the designer will need to make trade-offs between desired gain margin and confinement and then determine what value or set of values of spacer thickness 460 will provide both an acceptable gain margin and confinement. The same process will have to be accomplished for the other design parameters and performance parameters until values of all the design parameters are determined that provide an overall optimized laser 400 performance.

Figure 13:
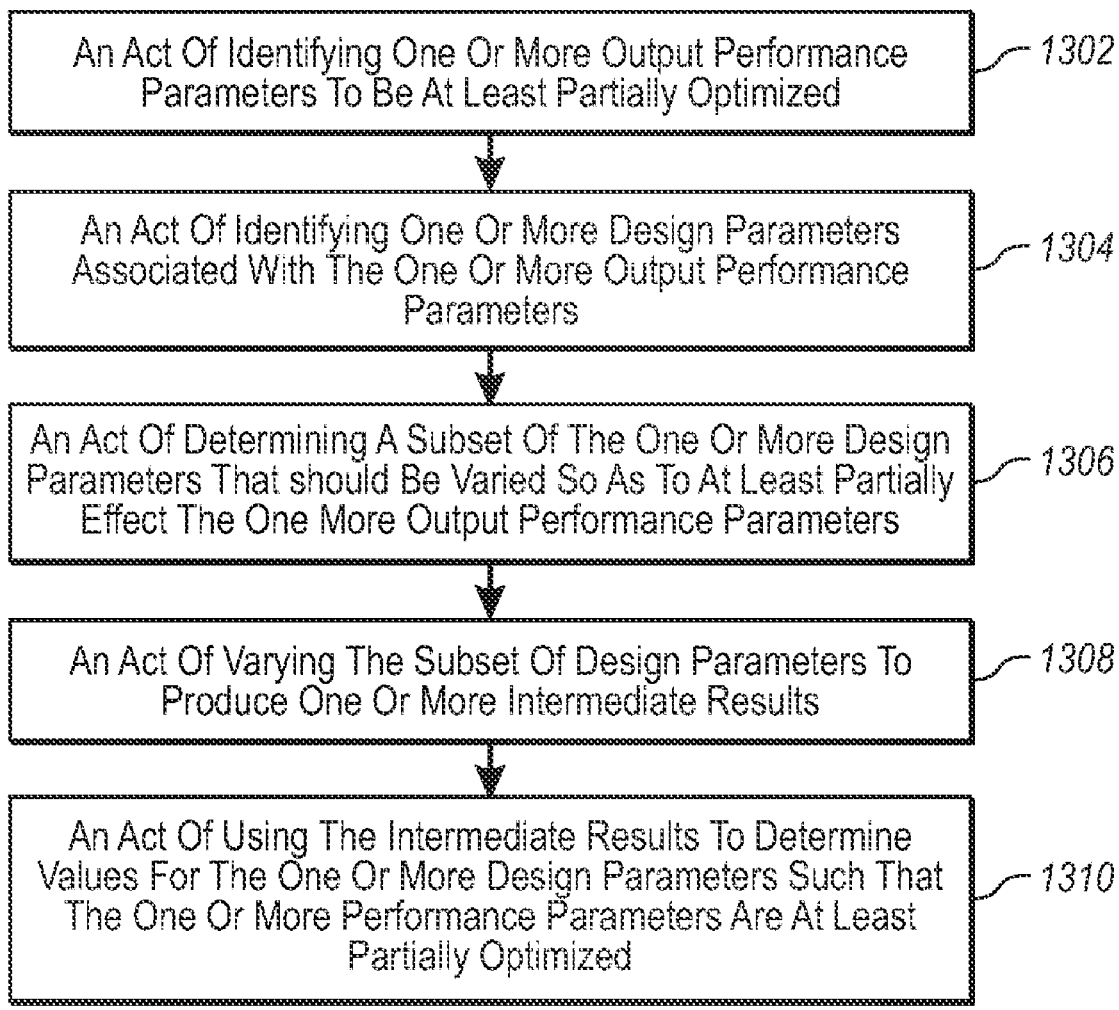
FIG. 13 illustrates a flowchart of a method for at least partially optimizing one or more output performance parameters of a laser die in accordance with examples disclosed herein.

Turning now to FIG. 13, a flowchart of a method 1300 for at least partially optimizing one or more output performance parameters of a laser die is illustrated. Method 1300 will be explained in relation to the other figures previously described above, although method 1300 is not limited to such examples.

Method 1300 includes an act of identifying one or more output performance parameters to be at least partially optimized (act 1302) and an act of identifying one or more design parameters associated with the one or more output performance parameters (act 1304). For example, one or more of the output performance parameters listed in Table 1 and one or more of the design parameters listed in Table 2 are identified.

Method 1300 also includes an act of determining a subset of the one or more design parameters that should be varied so as to at least partially effect the one or more output performance parameters (act 1306) and an act of varying the subset of design parameters to produce one or more intermediate results (act 1308). As previously described, the various design parameters are varied to produce intermediate results.

Method 1300 further includes an act of using the intermediate results to determine values for the one or more design parameters such that the one or more performance parameters are at least partially optimized (act 1310). As previously described, trade-offs may be made based on the intermediate results to achieve values or sets of values for one or more of the design parameters that at least partially optimize one or more of the performance parameters.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

We claim:

1. A method of at least partially optimizing output performance for a laser die, the method comprising:
   an act of identifying a first design parameter for a first laser die;
   an act of identifying a second design parameter for a second laser die, the first and second design parameters configured to at least partially affect one or more output performance parameters of a laser die;
   an act of varying the first design parameter to produce first intermediate performance results for the first laser die;
   an act of varying the second design parameter to produce second intermediate performance results for the second laser die; and
   an act of using the first and second intermediate performance results to determine a value for the first and second design parameters that at least partially optimizes the one or more output performance parameters for a third laser die.

2. The method in accordance with claim 1, further comprising:
an act of identifying a third design parameter;
an act of varying the third design parameter to produce third intermediate performance results; and
an act of determining a value for the third design parameter that at least partially optimizes the one or more output performance parameters.

3. The method in accordance with claim 2, further comprising:
an act of identifying a fourth design parameter;
an act of varying the fourth design parameter to produce fourth intermediate performance results; and
an act of determining a value for the fourth design parameter that at least partially optimizes the one or more output performance parameters.

4. The method in accordance with claim 3, wherein the first and second design parameters are the same type of parameter and the third and fourth design parameters are the same type of parameter.

5. The method in accordance with claim 1, wherein the first and second design parameters are the same type of parameter.

6. The method in accordance with claim 1, wherein the act of using the first and second intermediate results to determine a value for the first and second design parameters such that an overall output performance of the laser die is at least partially optimized comprises:
an act of trading-off between the first and second design parameters until a value of the first and second design parameters is determined that produces an acceptable output performance of the laser die.

7. The method in accordance with claim 1, wherein the one or more output performance parameters comprise linearity of output power vs. current curve, modulation efficiency, speed at a certain current, and threshold current over temperature.

8. The method in accordance with claim 1, wherein the first and second design parameters are selected from a number of active region wells, a spacer layer thickness, distance between a mode modifier layer and an active region, thickness of the mode modifier layer, composition of mode modifier layer, width of a mesa layer, cavity length, and minor or facet reflectivities.

9. The method in accordance with claim 1, wherein the laser die is a Fabry-Perot (FP) laser.

10. The method in accordance with claim 1, wherein the laser die is a DFB laser.

* * * * *